United States Patent [19]

Vlasveld

[11] Patent Number: 4,952,961

[45] Date of Patent: Aug. 28, 1990

[54] APPARATUS FOR PROCESSING A PRINTING PLATE WITH A LIQUID

[75] Inventor: Petrus J. Vlasveld, Garderen, Netherlands

[73] Assignee: Machinehandel Houtstra BV, Nijkerk, Netherlands

[21] Appl. No.: 378,410

[22] Filed: Jul. 11, 1989

[30] Foreign Application Priority Data

Jul. 28, 1988 [NL] Netherlands ............... 8801893

[51] Int. Cl.⁵ ............... G03D 5/00; B41N 3/00
[52] U.S. Cl. ................... 354/317; 354/319; 15/77; 15/102
[58] Field of Search ............ 354/317, 319; 15/77, 15/100, 102

[56] References Cited

U.S. PATENT DOCUMENTS

| 3,528,358 | 9/1970 | Pickard | 354/317 |
| 3,719,133 | 3/1973 | Haracz | 354/317 |
| 4,034,433 | 7/1977 | Slingsby | 15/77 |
| 4,428,659 | 1/1984 | Howard | 354/317 |
| 4,464,035 | 8/1984 | Schoering | 15/77 |
| 4,740,075 | 4/1988 | Schoernig | 15/77 |

FOREIGN PATENT DOCUMENTS

0225678 6/1987 European Pat. Off. .

Primary Examiner—A. A. Mathews
Attorney, Agent, or Firm—Lorusso & Loud

[57] ABSTRACT

An apparatus for processing a printing plate with a liquid comprises two liquid containing containers open at their upper side, wherein a plurality of rotating brushes is provided in each container. These brushes are at least partially immersed in the liquid. Further, means for moving the printing plate along the brushes are provided, which means comprises a support table for the printing plate which is coupled with a central guiding beam extending above the containers in a closed processing compartment. The support table is movable backward and forward in the longitudinal and lateral direction of the guiding beam with respect to the guiding beam over the brushes.

20 Claims, 9 Drawing Sheets

APPARATUS FOR PROCESSING A PRINTING PLATE WITH A LIQUID

The invention relates to an apparatus for processing a printing plate with a liquid, comprising two liquid containing containers open at their upper side, wherein a plurality of rotating brushes is provided in each container, said brushes being at least partially immersed in the liquid, and means for moving the printing plate along the brushes.

Such apparatus are known in practice in several embodiments and an example of such an apparatus is described in Dutch patent application 8503402. An apparatus of this type is adapted for processing printing plates made of a photopolymer, wherein portions of the printing plate which are not exposed to ultra-violet light, should be washed out. These unexposed portions of the printing plate soften due to the liquid used and are brushed away by the rotating brushes. For obtaining printed matter of high quality it is of great importance that the unexposed portions of the printing plate are fully removed and nowhere remainders are left. Upto the present the prior art apparatus do not always obtain an optimum quality of the printing plate. In the known apparatus for example the printing plate clamps at one side only is pulled through the apparatus over the brushes by means of a transport chain, wherein the brushes are moved backward and forward with respect to the printing plate for a good processing result. However, the printing plates are not processed in a flat position and the construction of the known apparatus is complicated in view of the required lateral movement of the brushes.

The invention aims to provide an improved apparatus of the above-mentioned kind wherein said disadvantages are obviated in an effective manner.

To this end the apparatus according to the invention is characterized in that said means comprises a support table for the printing plate which is coupled with a central guiding beam extending above the containers in a closed processing compartment, wherein the support table is movable backward and forward in the longitudinal and lateral direction of the guiding beam with respect to the guiding beam over the brushes.

In this manner an apparatus is obtained wherein the desired movement of the printing plate with respect to the brushes is obtained by moving the support table both in the longitudinal direction and in the lateral direction so that the brushes has to be rotatably driven only. The support table provides for a flat support of the printing plate, whereby the surface of the printing plate can be processed in a well manner. The closed processing compartment makes it possible to exhaust the fumes developing during the processing, which is very favourable in an environmental point of view.

Preferably the movement velocities of the support table in the longitudinal and lateral direction are mutually different, whereby a more or less random rotating movement of the support table with respect to the brushes is obtained, which results in a very well processing of the printing plate.

According to a favourable embodiment the guiding beam extends into a feed compartment adjacent the containers.

According to the invention a drying unit for drying the processed printing plate is provided in the feed compartment.

According to a very favourable embodiment of the invention the guiding beam is rotatable between a feed position and a processing position, and the support table is rotatably coupled with the guiding beam and is directed towards an access opening in the feed position in the feed compartment and is directed towards the containers in a substantially horizontal position in the processing position. Thereby, applying the printing plate on the support table is very simple.

According to a preferred embodiment of the invention the supporting table is provided with two opposite clamps for clamping the corresponding sides of a printing plate to be treated, wherein one of said clamps is movable backward and forward for stretching the clamped printing plate. Thereby the apparatus is suited for printing plates of various sizes, wherein a perfect flat support of the printing plate to be processed is obtained by stretching the clamped printing plate.

The invention will hereafter be further explained with reference to the drawings in which an embodiment of the apparatus to the invention is shown.

Referring to the drawings there is shown an apparatus 1 for processing a printing plate 2 with a liquid. The apparatus 1 comprises a feed compartment 3 and a processing compartment 4, in which two containers 5 and 6 open at their upper side are provided. The container 5 most distant from the feed compartment 3 is made as main processing container, while the container 6 lying between said main processing container 5 and the feed compartment 3 is made as flushing container. For each of both containers 5, 6 a liquid tank 7 and 8, respectively, is provided, from which the liquid can be pumped to the container 5 and 6, respectively.

Fourteen rotating brushes 9 are mounted in the main processing container 5, which brushes are rotatably driven by a common driving through a chain not shown. In the flushing container 6 two rotating brushes 10 and a rotating brush 11 are mounted. The brush 11 adjacent the feed compartment 3 operates as a wiping brush as will be explained hereinafter. The containers 5, 6 are supported in a common frame 12 and are movable up and down by means of a shaft 14 driven through a chain 13, at the ends of which shaft 14 for example excentric discs not shown can be mounted for pushing the frame 12 upwardly. The position of the frame 12 is determined by means of a plurality of position sensors 15.

Figure 8:
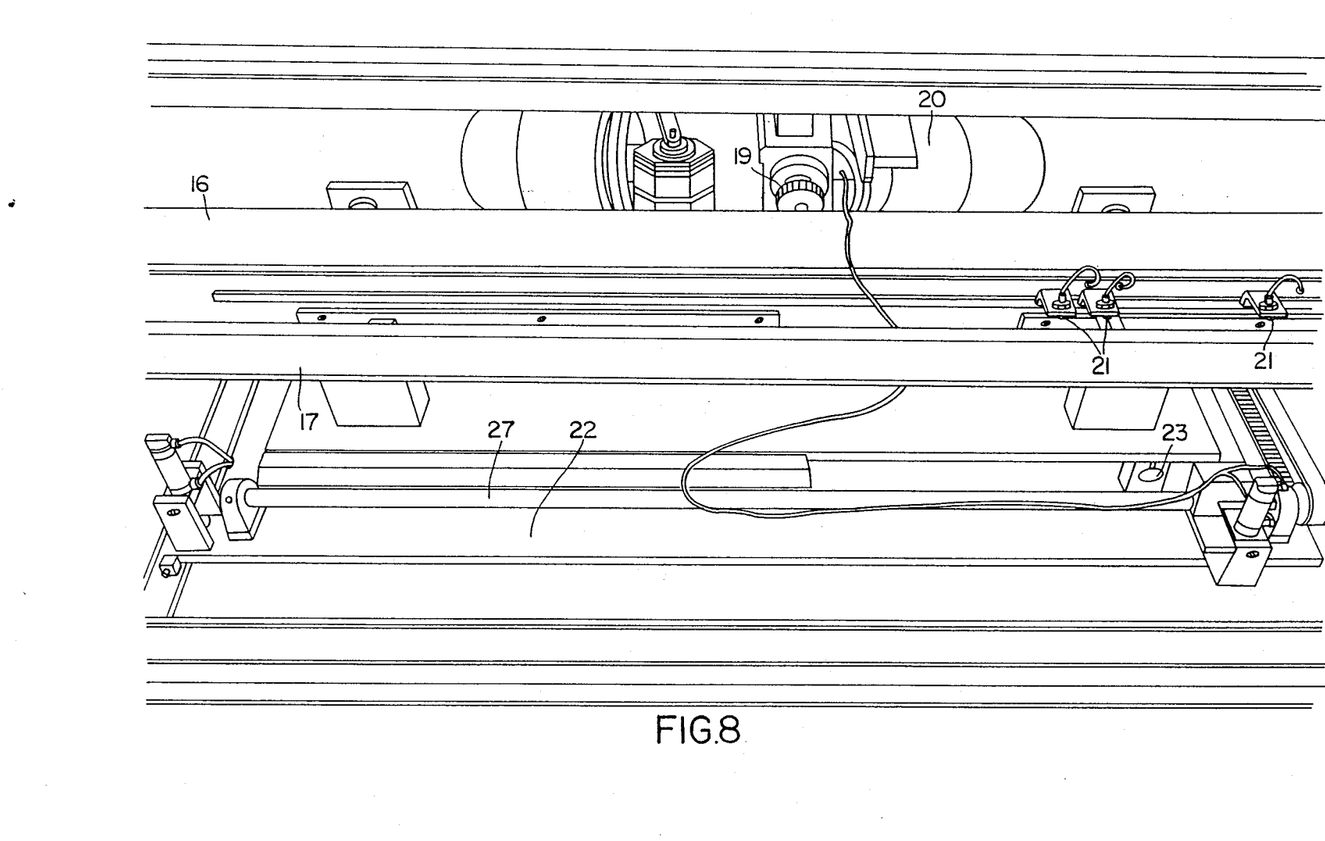
FIG. 8 shows an open front view of the processing compartment of the apparatus of FIG. 1.
Figure 9:
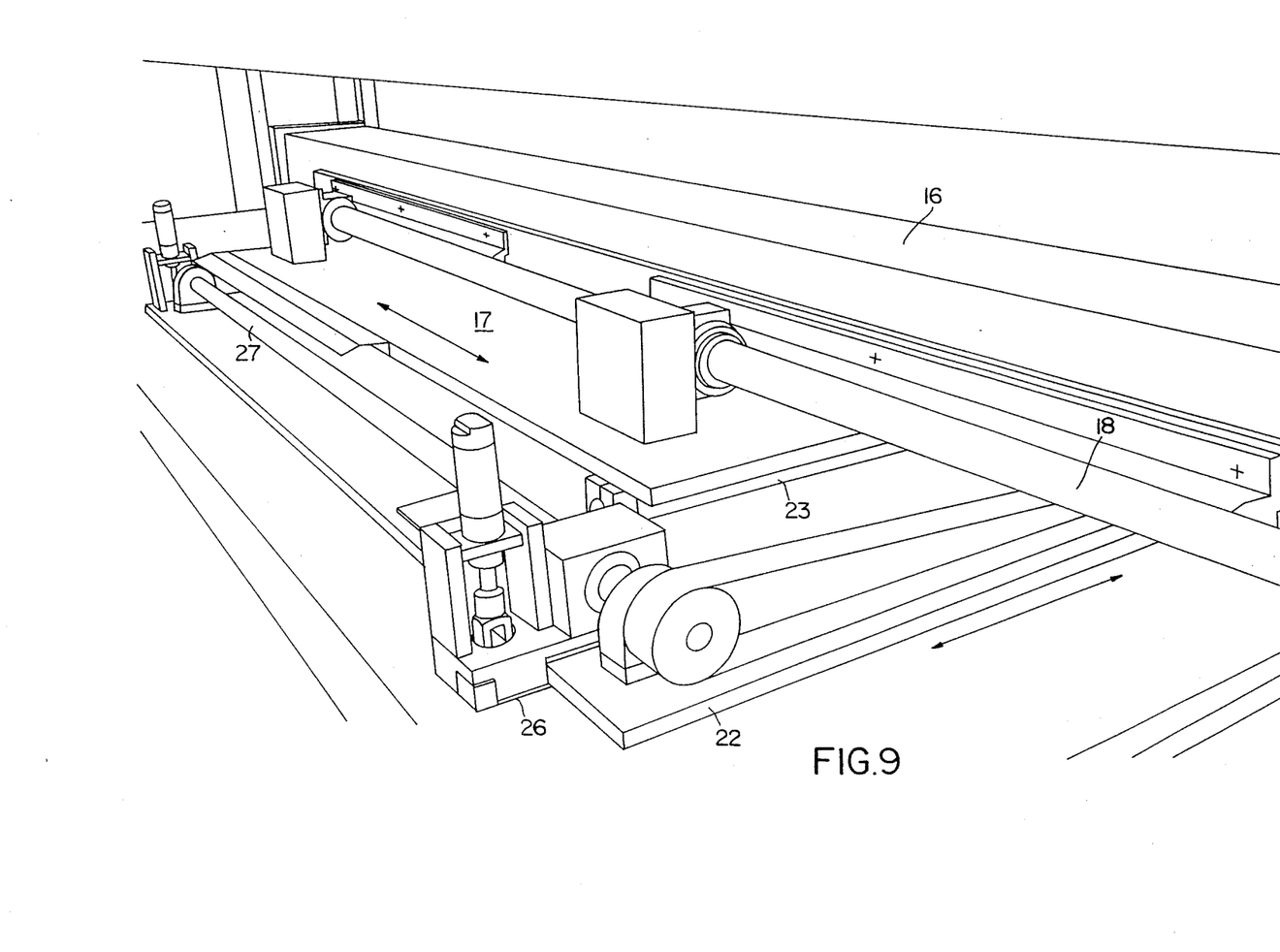
FIG. 9 shows an open perspective view of the processing compartment of FIG. 1.

A central guiding beam 16 is mounted in the apparatus 1, which guiding beam extends along the whole length of the apparatus in the feed compartment 3 and the processing compartment 4. The guiding beam 16 carries a slide 17 which on one side is coupled with a guiding rod 18 (see FIG. 7-9) carried by the guiding beam 16 and engages through a gear wheel 19 a not shown gear rack attached to the guiding beam 16. The gear wheel 19 can be driven by a motor 20, whereby the slide 17 is movable backward and forward in the longitudinal direction of the beam. The position of the slide 17 can be detected by means of a plurality of position sensors 21.

A support table 22 is mounted on the slide 17, which support table is movable lateral to the guiding beam 16 with respect to the slide by means of two lateral guiding rods 23, 24 and a motor supported by the slide 17.

Figure 1:
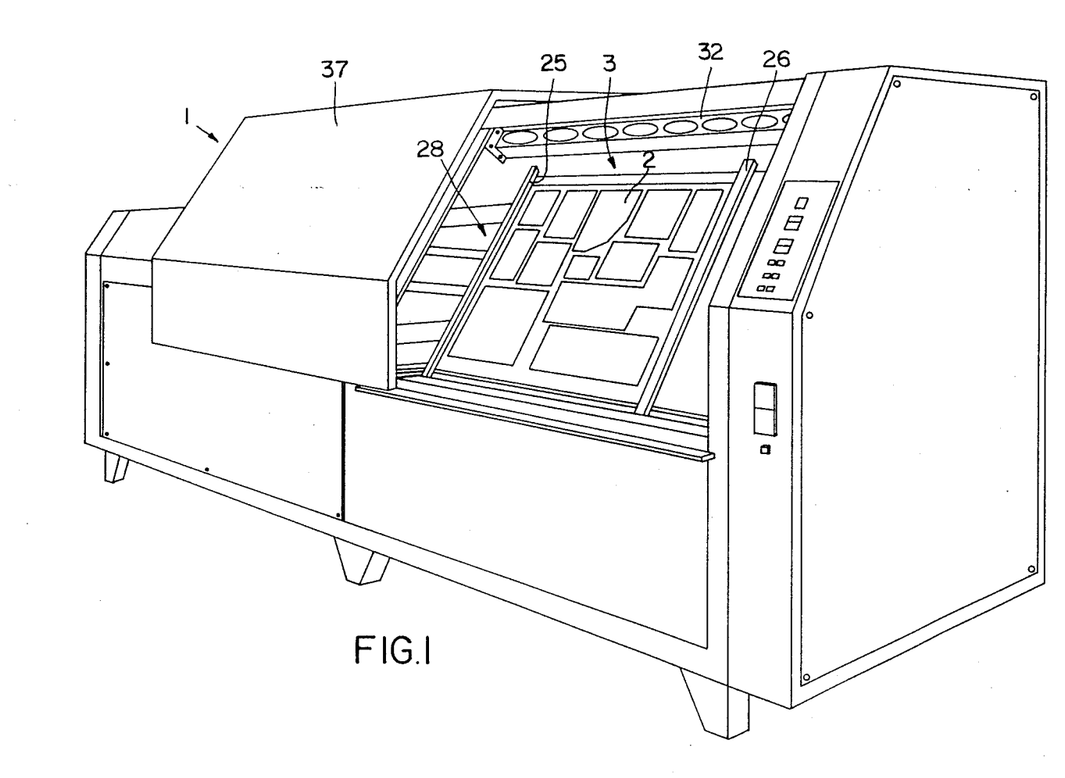
FIG. 1 shows a perspective view of an embodiment of the apparatus according to the invention.
Figure 6:
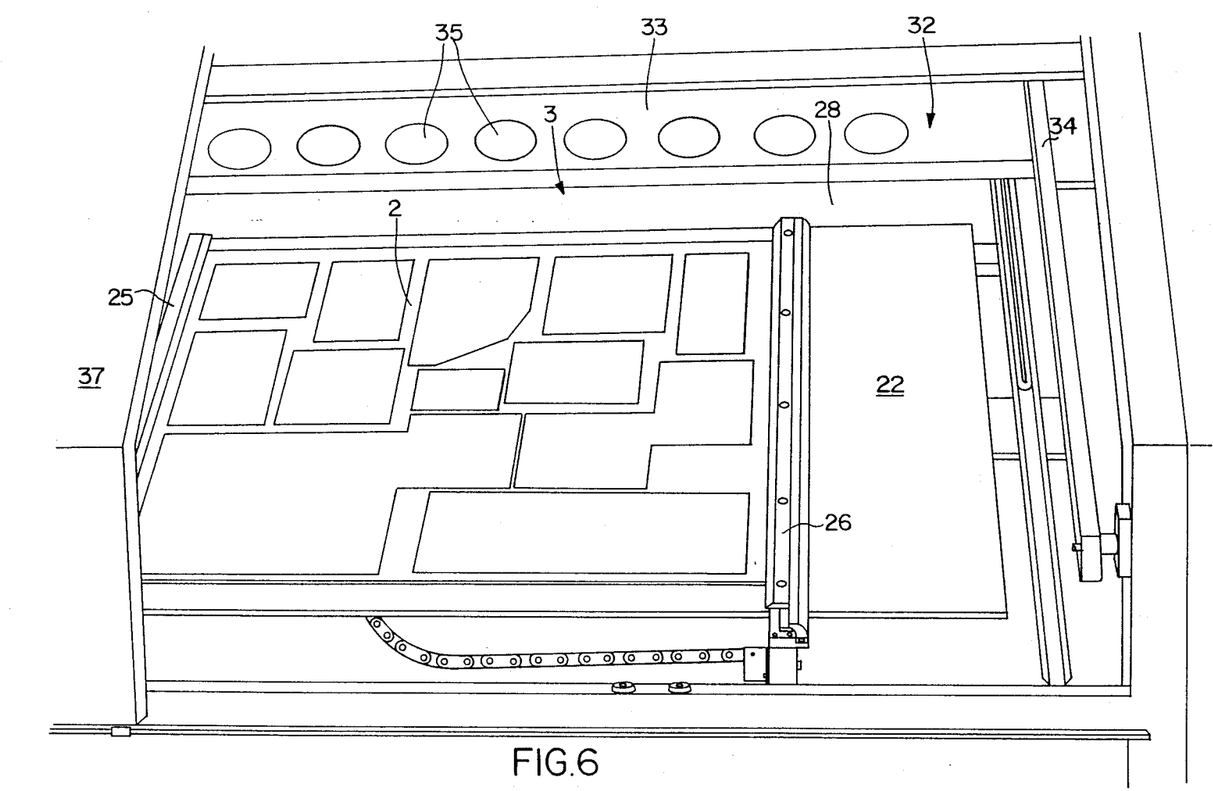
FIG. 6 shows a view of the feed compartment of the apparatus of FIG. 1 at a larger scale.

As shown in FIG. 1 and 6, the support table 22 is provided at both sides with a clamp 25 and 26, respectively, for clamping the printing plate 2. The clamp 25 is stationary mounted, while the clamp 26 is movable backward and forward with respect to the support table 22 by means of two screwed spindels 27 mounted at the backside of the support table 22, only one being shown in FIG. 8 and 9. Thereby printing plates of various sizes can be clamped on the support table 22, wherein the clamped printing plate can be stretched into a fully flat position on the support table 22.

Figure 3:
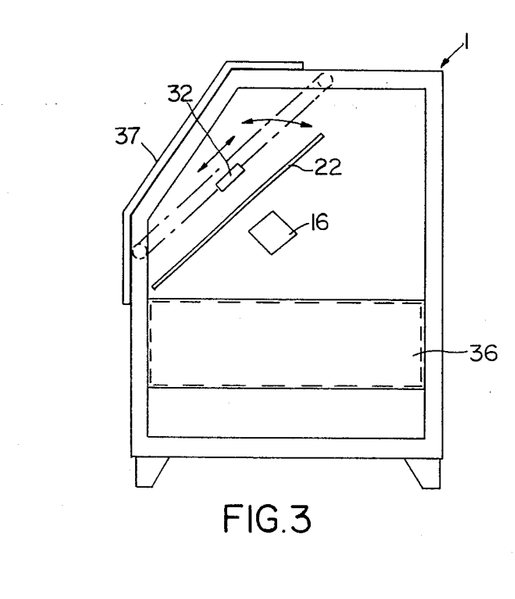
FIG. 3 shows a schematic side view of the apparatus of FIG. 1, in which the guiding beam is in the feed position.
Figure 4:
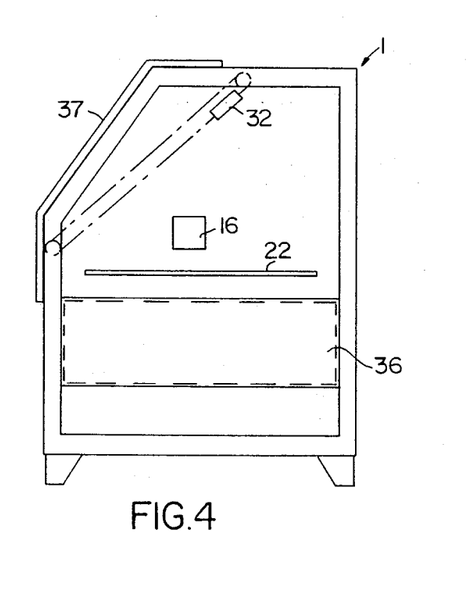
FIG. 4 shows a side view corresponding with FIG. 3, in which the guiding beam is in the processing position.
Figure 7:
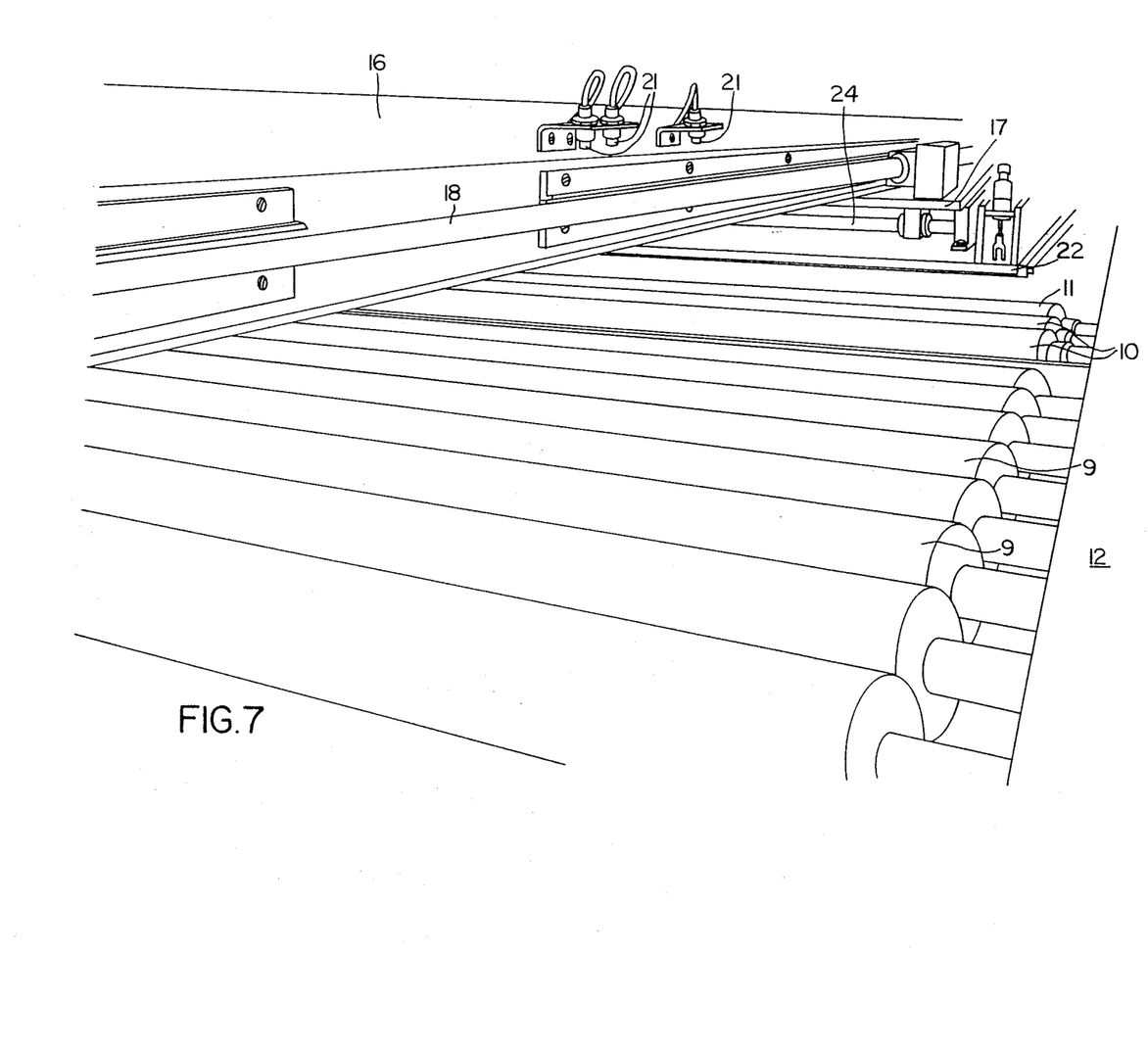
FIG. 7 shows an open perspective view of the apparatus of FIG. 1, in which the guiding beam is in the processing position.
Figure 10:
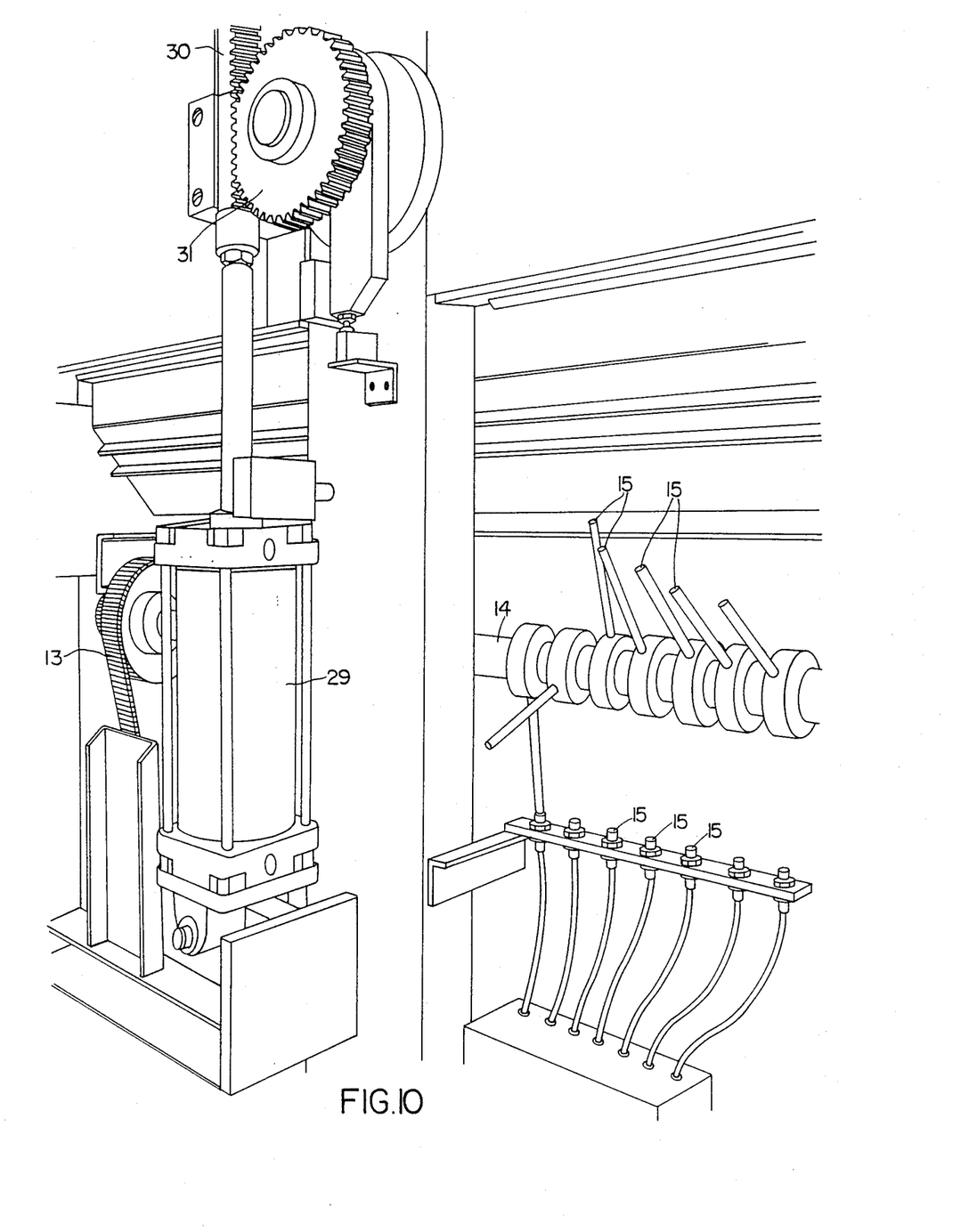
FIG. 10 shows a side view of the apparatus of FIG. 1, in which the rotational driving of the guiding beam is shown.

As can be seen in the drawings, the guiding beam 16 is rotatably mounted in the apparatus between a feed position schematically indicated in FIG. 3 and a processing position schematically indicated in FIG. 4. In the feed position which is further shown in FIG. 1 and 6 and which can only be taken in the feed compartment, the support table 22 is directed towards a feed opening 28 and the printing plate 2 can be disposed on the support table 22. Two opposite edges of the printing plate 2 are clamped by the clamps 25 and 26, whereafter the clamp 26 stretches the printing plate 2 on the support table 22. The guiding beam 16 with the support table 22 is than rotated into the processing position of FIG. 4 by means of a cylinder piston assembly 29 shown in FIG. 10 and driving through a gear rack 30 a gear wheel 31 mounted on one end of the guiding beam 16. In the processing position the support table 22 can be moved from the feed compartment 3 to the processing compartment 4 as shown in FIG. 7. As soon as the support table 22 is above the main processing container 5, the frame 12 is moved upwardly so that the brushes 9 at least partially immersed in the liquid can treat the printing plate 2. As appears in particular from the top view of FIG. 5, the length of the main processing container 5 is greater than the length of the support table 22. During the processing with the liquid the slide 17 is moved backward and forward in the longitudinal direction of the guiding beam 16, whereas the support table 22 is moved backward and forward lateral to the guiding beam 16, wherein the movement velocities are mutually different. Thereby a more or less random rotating movement of the printing plate 2 stretched on the support table 22 along the brushes 9 is obtained, which results in an optimum processing of the printing plate 2 with the liquid.

The height position of the frame 12 is chosen in accordance with the thickness of the printing plate to be processed, wherein the chosen height is determined by one of the position sensors 15. During processing the brushes 9 are rotated by a common driving which also rotates the wiping brush 11 of the flushing container 6, so that the brush 11 is flushed in the flushing container.

When the processing above the main processing container 5 is finished after a predetermined time period, the support table 22 is slowly moved back to the feed compartment 3 while passing the flushing container 6. During this movement the brushes 9 and therefore also the wiping brush 11 are kept stationary.

The brushes 10 which are at least partially immersed in a complete clean liquid from the tank 8, are rotatably driven. Thereby the printing plate 2 is cleaned by the brushes 10, wherein the wiping brush 11 wipes substantially all liquid from the printing plate 2. As appears from FIG. 2, the axis of the brushes 10, 11 lies a little higher than the axis of the brushes 9, so that during flushing the printing plate 2 this printing plate does not contact the brushes 9 anymore.

When the support table 22 is in the feed compartment 3 again, the guiding beam 16 with the support table 22 is brought back into the feed position. Subsequently, a drying unit 32 is put into operation for drying the processed printing plate 2. This drying unit 32 comprises a drying box 33 which is moveable backward and forward above the support table 22 along two rails 34, only one of which being shown in FIG. 6, and which drying box comprises a plurality of adjacent fans 35. The drying unit 32 dries in this manner the printing plate 2 by blowing, wherein any adhering liquid is received in a container 36 (see FIG. 2).

During the complete processing of the printing plate 2, the apparatus is completely closed as the feed opening 28 can be closed by a door 37, so that fumes formed during processing can be exhausted from the apparatus 1. After drying the printing plate 2, the door 37 is opened and the processed printing plate 2 can be removed and a next printing plate to be processed can be fed.

Figure 2:
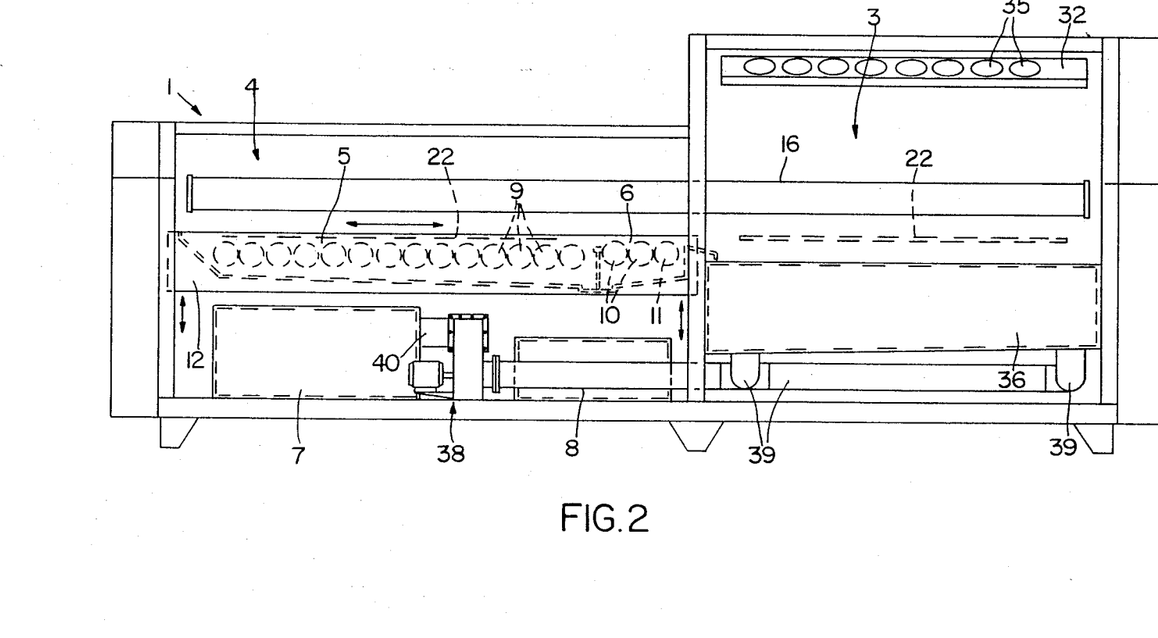
FIG. 2 schematically shows an open front view of the apparatus of FIG. 1.
Figure 5:
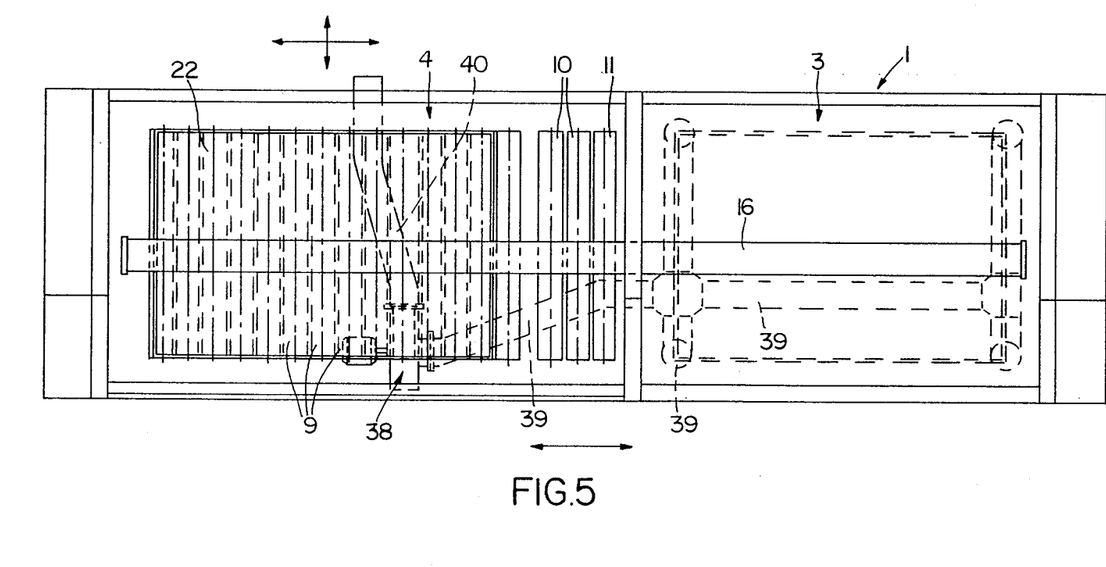
FIG. 5 schematically shows an open top view of the apparatus of FIG. 1.

According to a preferred embodiment of the apparatus an exhaust unit is provided which is schematically shown in FIG. 2 and 5. The exhaust unit comprises an exhaust fan 38 connected with the feed compartment 3 through tubes 39. In the embodiment shown the tubes 39 are connected to the container 36. The exhausted fumes are exhausted from the apparatus through a tube 40. A further exhaust tube can be connected to the tube 40.

The exhaust fan 38 is put into operation at such a low level during processing a printing plate that a small under pressure is generated in the apparatus so that no fumes can escape to the outside on the one side, however, on the other side only a little amount of fumes are exhausted. During drying the exhaust fan 38 is switched on full power so that it is guaranteed that all fumes are exhausted from the apparatus at the time that the door 37 is opened.

The control of the operation of the complete apparatus may take place by means of a programmable control apparatus or the like in a suitable manner.

According to an alternative embodiment of the apparatus a second feed position of the guiding beam 16 is provided, in which second feed position the support table 22 is in a horizontal position with the clamps 25, 26 directed upwardly. In this position printing plates of large sizes can be fed easier.

By the tightly stretched support of the printing plate 2 on the support table 22 a very high quality of the printing plate can be obtained. The random rotating movement of the printing plate 2 along the brushes 9 of the main processing compartment 5 results in a very intensive processing of the printing plate 2 with the liquid, which also results in an optimum end result. Flushing the processed printing plate 2 with clean liquid in the flushing container 6 cleans the printing plate 2 from photopolymer material remainders and liquid, wherein the wiping brush 11 removes substantially all adhering liquid.

The invention is not restricted to the above described embodiment which can be varied in a number of ways within the scope of the invention.

I claim:

1. Apparatus for processing a printing plate with a liquid, comprising first and second liquid containing containers each container being open at its upper side, wherein a plurality of rotating brushes is provided in each container, said brushes being at least partially immersed in the liquid, and means for moving the printing plate along the brushes, wherein said means comprises a support table for the printing plate which is coupled with a central guiding beam extending above the containers in a closed processing compartment, the support table is being movable backward and forward in the longitudinal and lateral direction of the guiding beam with respect to the guiding beam over the brushes.

2. Apparatus according to claim 1, wherein the movement velocities of the support table in the longitudinal and lateral direction are mutually different.

3. Apparatus according to claim 2, wherein the guiding beam extends into a feed compartment adjacent the containers.

4. Apparatus according to claim 3, wherein a drying unit for drying the processed printing plate is provided in the feed compartment.

5. Apparatus according to claim 3, wherein the guiding beam is rotatable between a feed position and a processing position, and wherein the support table is rotatably coupled with the guiding beam and is directed towards an access opening in the feed position in the feed compartment and is directed towards the containers in a substantially horizontal position in the processing position.

6. Apparatus according to claim 5 wherein the access opening can be closed by a door.

7. Apparatus according to claim 1, wherein the support table is mounted on a slide movable in the longitudinal direction of the guiding beam, whereas the support table is movable lateral to the guiding beam with respect to the slide.

8. Apparatus according to claim 1, wherein the support table is provided with two opposite clamps for clamping the corresponding side of a printing plate to be processed, wherein one of said clamps is movable backward and forward for stretching the clamped printing plate.

9. Apparatus according to claim 5, wherein the drying unit is movable backward and forward over the support table in the feed position of the support table.

10. Apparatus according to of claim 1, further comprising a drying unit wherein the drying unit comprises a drying box extending along the length of the support table and including a plurality of adjacent fans.

11. Apparatus according to of claim 1, wherein the first container is positioned most distant from the feed compartment and has a greater length than the support table and is made as main processing container, wherein in a first processing step the support table is movable backward and forward in longitudinal and lateral direction above the main processing container only.

12. Apparatus according to claim 11, wherein the second container is made as flushing container, wherein the brushes of the flushing container flush the processed printing plate clean during the transport of the support table from the main processing container to the feed compartment.

13. Apparatus according to claim 12, wherein the brush of the flushing container adjacent the feed compartment is stationary during the transport of the support table from the main processing container to the feed compartment and operates as wiping brush.

14. Apparatus according to claim 13, wherein the wiping brush is rotatable in the flushing container during the processing of the printing plate above the main processing container.

15. Apparatus according to claim 14, wherein the brushes of the main processing container and the wiping brush have a common driving.

16. Apparatus according to claim 12, wherein the containers are supported in a common frame movable up and down and the highest point of the brushes in the flushing container lies higher than the highest point of the brushes in the main processing container.

17. Apparatus according to claim 16, wherein the high position of the frame is adjustable.

18. Apparatus according to claim 4, wherein an exhauster is provided for exhausting liquid fumes from the apparatus.

19. Apparatus according to claim 18, wherein the exhauster operates with a fraction of the nominal exhaust capacity during the processing of a printing plate with liquid and with full exhaust capacity during drying the printing plate.

20. Apparatus according to claim 5, wherein the support table is provided with clamps for clamping a printing plate to be processed and wherein the guiding beam is rotatable into a second feed position, in which the support table is in a horizontal position with said clamps directed upwardly.

* * * * *